United States Patent
Bonnot

(10) Patent No.: US 6,304,147 B1
(45) Date of Patent: Oct. 16, 2001

(54) METHOD AND CIRCUIT FOR REDUCED POWER CONSUMPTION IN A CHARGE PUMP CIRCUIT

(75) Inventor: Jean-Louis Bonnot, Mougins (FR)

(73) Assignee: Koninklijke Philips Electronics N.V., Eindhoven (NL)

(*) Notice: Subject to any disclaimer, the term of this patent is extended or adjusted under 35 U.S.C. 154(b) by 0 days.

(21) Appl. No.: 09/535,948

(22) Filed: Mar. 27, 2000

(51) Int. Cl.[7] ............... H03L 7/085; H03L 7/089
(52) U.S. Cl. ............... 331/17; 331/1 A; 331/8; 331/14; 327/156; 327/157; 327/159; 327/111
(58) Field of Search ................ 331/1 A, 8, 14, 331/17, 18, 25; 327/156–159, 111, 112; 375/376; 455/260; 360/51

(56) References Cited

U.S. PATENT DOCUMENTS

| | | | |
|---|---|---|---|
| 4,814,726 | * 3/1989 | Byrd et al. | 331/1 A |
| 5,475,326 | * 12/1995 | Masuda | 327/157 |
| 5,598,405 | 1/1997 | Hirose | 370/280 |
| 5,783,972 | 7/1998 | Nishikawa | 331/17 |
| 5,847,614 | * 12/1998 | Gilbert et al. | 331/14 |
| 5,933,031 | 8/1999 | Konno | 327/7 |
| 5,986,487 | * 11/1999 | Ridgers | 327/157 |

* cited by examiner

*Primary Examiner*—David Mis
(74) *Attorney, Agent, or Firm*—Lacasse & Associates

(57) ABSTRACT

A charge pump circuit for use with a phase locked loop is described. The circuit has an input port for receiving a signal indicative of a misalignment between two clock signals. It also has an output port at which a drive signal is provided. The drive signal is provided when the comparison result is indicative of misalignment of the signals. When the signals are aligned, a high impedance is provided at the output port and the charge pump circuit or a portion thereof enter a sleep mode to reduce power consumption of the charge pump when providing a high impedance at the output port.

19 Claims, 7 Drawing Sheets

METHOD AND CIRCUIT FOR REDUCED POWER CONSUMPTION IN A CHARGE PUMP CIRCUIT

FIELD OF THE INVENTION

The present invention relates to charge pump circuits for use in phase locked loops. More specifically, the present invention relates to a reduced power state of a charge pump circuit.

BACKGROUND OF THE INVENTION

Timing circuits are a core portion of communication systems. Timing circuits are used to generate signals, to decode signals, and to synchronise circuits generating and sending signals and those circuits receiving and decoding those signals. In this fashion, a synchronous communication network proceeds with substantial efficiency of signal rate vs. clock rate.

Phase locked loop circuits are a common solution to synchronising two signals and for frequency synthesis to generate a local oscillation in transceiver circuits. They are used in many different applications, such as in communication and networking systems. For example, microprocessor chips require on-chip clock generation. A phase locked loop enables a precise tracking and phase locking of a synthesized clock signal to a reference clock signal.

Some prior art phase locked loops operate based on analog algorithms. Such systems are subject to very large phase errors and are heavily influenced by random noise. Because of the analog nature of such systems they are difficult to highly integrate. Also, functions such as a divide by N or edge registration are difficult to implement in an integrated device. Analog systems are also relatively susceptible to loss of phase lock or incapability of obtaining phase lock because of random variations in the system.

Other prior art phase locked loops operate based on digital algorithms. One such phase locked loop (PLL) is identified as MT9042B available from Mitel Corporation and is described in detail in Issue 11 of their publication "Digital Switching & Networking Components". If network synchronization is temporarily disrupted, the MT 9042B provides timing and synchronization signals based on storage techniques. The stored values are determined during synchronized mode when an external reference signal is available and the clock is locked to the external reference signal. When the external reference signal is lost, the stored values are used to attempt to maintain the output clock signal.

Because of the widespread use of wireless communications, it is desirable to reduce power consumption of timing circuits. For example, in U.S. Pat. No. 5,933,031 in the name of Konmo a clock signal generating device is disclosed having an which the phase frequency detector outputs—UP and DOWN—are forcibly set to opposite values. This reduces power consumption when the two signals would otherwise be a same value.

In U.S. Pat. No. 5,783,972 in the name of Nishikawa, another power saving PLL circuit is presented. According to the disclosure, a charge pump circuit is provided with a plurality of different current sources for each of the UP and DOWN output ports. This allows for lower power operation of the charge pump when variations in phase frequency are small. Since this is the most common occurrence in a stable communication system, the overall PLL power consumption is reduced. That said, the proposed circuit requires several current sources for each output port and, as such, is more complicated than previously used circuits.

In U.S. Pat. No. 5,598,405 in the name of Hirose, another power saving circuit is presented. Here the phase control loop is only "turned on" preceding each transmission time slot and each reception timeslot. As such, when only a few of several time slots are used, the phase control loop is enabled less than all the time. This results in power savings.

It is an object of the present invention to provide a PLL for consuming less power than a simple prior art PLL circuit while providing similar functionality.

SUMMARY OF THE INVENTION

According to the invention a charge pump circuit is provided that consumes a reduced amount of power when neither an "UP" nor a "DN" signal is being provided. Preferably, the charge pump circuit is provided with a reasonable setup time so that operation of the phase locked loop is not affected by the reduced power consumption mode of operation.

In accordance with the invention there is provided a charge pump circuit for use with a phase locked loop. The circuit includes: an input port for receiving a signal indicative of a misalignment between two clock signals; an output port; a circuit for providing a drive signal at the output port when the comparison result is indicative of misalignment of the signals and for providing high impedance at the output port when the comparison result is indicative of alignment of the signals; and, a circuit for entering a sleep mode to reduce power consumption of the charge pump when providing a high impedance at the output port.

In accordance with another embodiment of the invention there is provided a charge pump phase locked loop circuit comprising: a voltage controlled oscillation circuit for receiving a drive signal and for providing a clock signal having an oscillation frequency controlled in dependence upon the drive signal; a phase frequency discriminator for receiving a reference signal and for comparing phases of a first signal derived from the clock signal and the reference signal with each other and for providing a comparison result indicative of phase alignment of the signals; and, a charge pump circuit comprising an output port and for providing the drive signal at the output port when the comparison result is indicative of misalignment of the signals and for providing high impedance at the output port when the comparison result is indicative of alignment of the signals, the charge pump circuit comprising logic for entering a sleep mode to reduce power consumption of the charge pump when providing a high impedance at the output port.

In accordance with another embodiment of the invention there is provided a charge pump circuit having an output port for use with a phase locked loop comprising the steps of: receiving a signal indicative of a misalignment between two clock signals; providing a drive signal at the output port when the comparison result is indicative of misalignment of the signals; providing high impedance at the output port when the comparison result is indicative of alignment of the signals; and, when providing a high impedance at the output port, causing the charge pump to enter a sleep mode to reduce power consumption of the charge pump.

BRIEF DESCRIPTION OF THE DRAWINGS

Exemplary embodiments of the invention will now be described in accordance with the drawings in which.

DETAILED DESCRIPTION OF THE INVENTION

According to the invention, an improved charge pump circuit for use with a DPLL is presented. The charge pump circuit is provided with a state in which power consumption is reduced. Such a state is preferably implemented transparent to the remainder of the DPLL and therefore results in no significant performance effects. That said, the reduced power consumption is useful for many applications. For example, battery life in portable or mobile communication is extended by reducing circuit power consumption. Heat generated by the circuit is also reduced in this way. Other advantages to reducing power consumption are well known in the art.

The method and the apparatus in accordance with the invention is typically for use in a generating a local oscillation based on a reference timing signal provided. Typically, this is used to generate a local oscillation for use in a transceiver circuit for communication between two nodes. A clock signal is phase locked to a reference signal with a phase locked loop. Power consumption is reduced by initiating a "sleep-mode" in the charge pump when neither the Up signal nor the DN signal is active.

Figure 1:
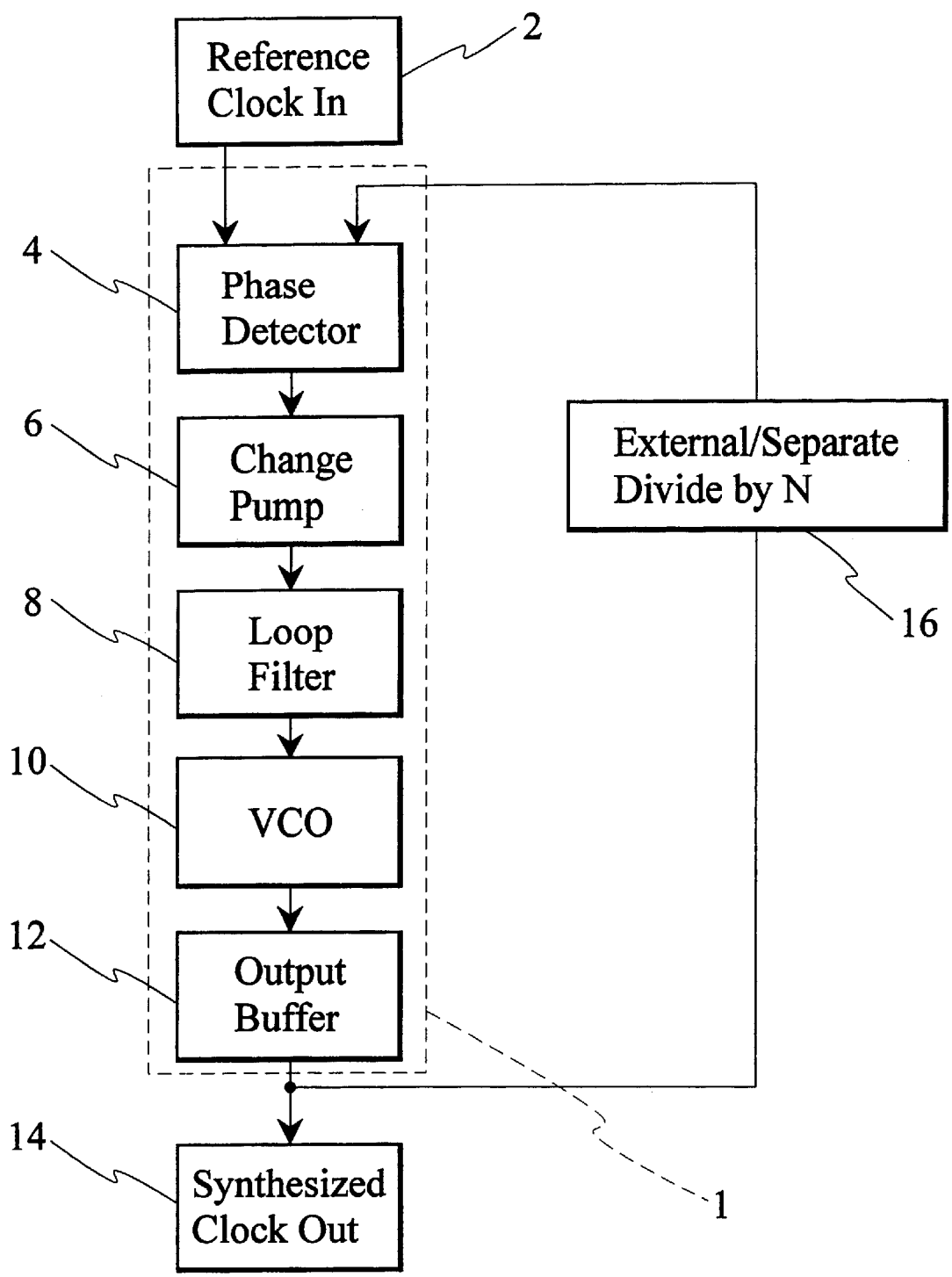
FIG. 1 shows a simplified schematic diagram of a prior art analog phase locked loop circuit.

FIG. 1 shows a simplified schematic of a prior art analog phase locked loop circuit 1 receiving a reference clock input signal 2 and generating a synthesized clock output signal 14. The analog phase locked loop circuit 1 has a phase detector 4 which receives the reference clock input signal 2 and divided clock signal generated by a divide by N circuit 16 derived from the synthesized clock output signal 14. The output of the phase detector 4 is serially processed by a charge pump 6 and a loop filter 8 and the output drives a voltage controlled oscillator (VCO) 10. The output of the VCO 10 is coupled to an output buffer 12 to produce the synthesized clock output signal 14.

A conventional analogue frequency synthesiser is usually composed of an oscillator (VCO), a phase/frequency detector (PFD), a charge pump (CP), a loop filter (LPF) and a feedback divider (DIVM). Optionally one also incorporates a direct divider.

Figure 2:
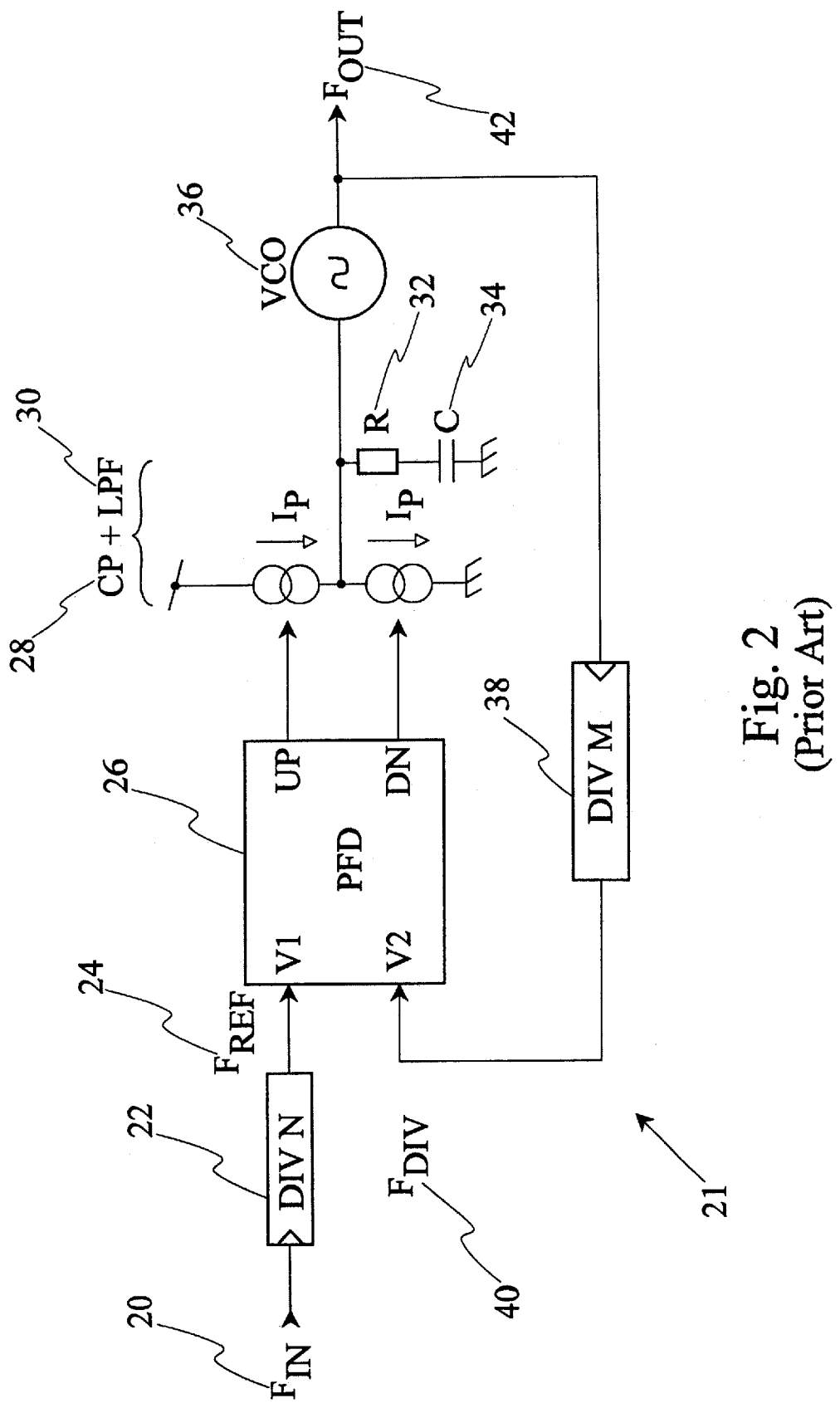
FIG. 2 shows a scheme of a conventional digital phase locked loop circuit.

In a conventional PLL circuit such as the PLL circuit 21 shown in FIG. 2, the power consumption of the charge pump is substantial whether it provides a DN (down) or an UP (up) signal.

FIG. 2 shows a block diagram of a conventional digital phase locked loop circuit 21 receiving a clock input signal 20 (FiN). The clock input signal 20 is optionally directed through a divide by N circuit 22 which generates a divided clock signal to produce the reference signal 24 (FREF). The reference signal 24 (FREF) enters the phase/frequency detector 26 (PFD) and is stored as frequency 1 (v1). In operation, the PFD 26 compares the phase/frequency of the phase locked loop signal 40 (FDiV) with the phase/frequency of the reference signal 24 (FREF). The phase locked loop signal is stored in the PFD 26 as frequency 2 (v2). The PFD 26 then compares phase of v1 with that of v2. Based on this comparison, the PFD 26 furnishes either an UP (up) or DN (down) signal according to the phase/frequency difference between the FREF 24 and FDiV 40.

In normal mode, the UP signal is furnished successively within a period of time during which there is a phase difference between $F_{REF}$ 24 and $F_{Div}$ 40. The pulse duration of the UP signal is proportional to the phase difference. The UP signal supplied by the PFD 26 is applied to the charge pump 28. The charge pump 28 supplies the voltage controlled oscillator (VCO) control voltage for controlling the oscillation frequency of the VCO 36 according to the UP signal and in co-operation with the loop filter 30 (LPF). The charge pump 28 supplies a charge to the LPF 30 or, alternatively, extracts a charge from the LPF 30 in accordance to the UP signal so as to cause the LPF 30 to produce the VCO control voltage. The VCO 36 oscillates to supply an output signal $F_{out}$ 42 having a frequency that differs according to the VCO control voltage furnished by the LPF 30. The divide by M frequency divider 38 (DIVM) receives the signal and divides its frequency by M to produce the signal $F_{Div}$ applied to the PFD 26. The VCO 36 generates the output frequency 42 ($F_{out}$) based on the comparison between the reference frequency 24 ($F_{REF}$) and the frequency 40 ($F_{Div}$).

By way of simplified explanation, when neither an UP signal nor a DN signal is furnished because the two clock signals are properly synchronised, the charge pump circuit is placed in a sleep mode. In the sleep mode, the charge pump circuit idles in a high impedance state and some of its circuitry is temporarily disabled to reduce power consumption while in that mode. Of course, there are other considerations to ensure that the UP and DN signals can be provided when needed without substantial delay. Thus, sometimes when both UP and DN signals are not furnished, the circuit is maintained in other than its idle state.

Figure 3:
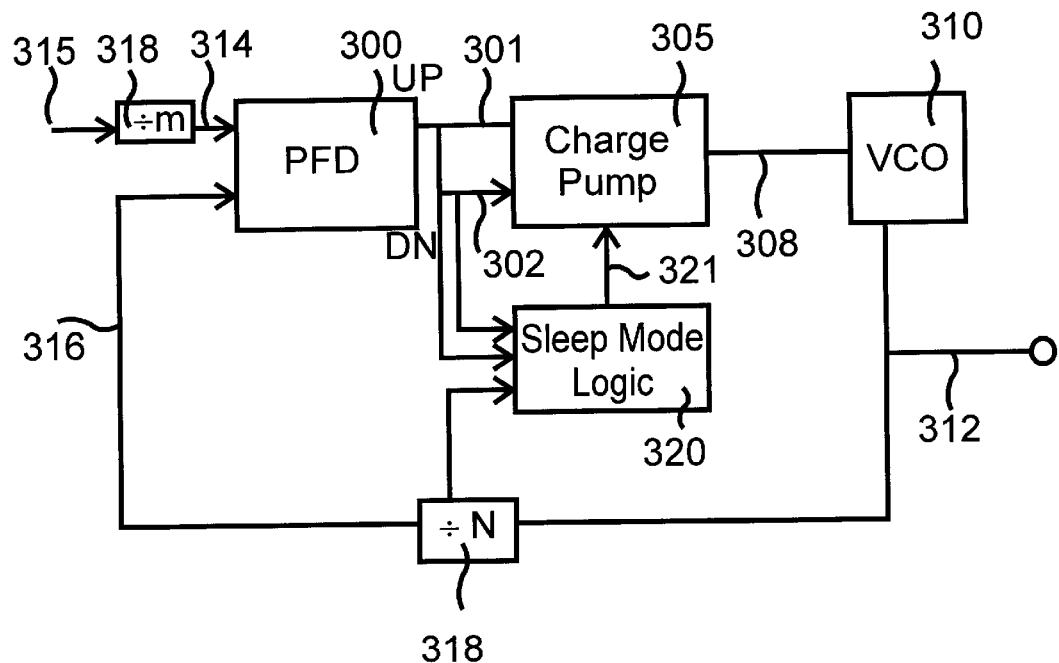
FIG. 3 shows a scheme of a digital phase locked loop circuit in accordance with the invention.

Referring to FIG. 3, a simplified block diagram of a phase locked loop according to the invention is shown. A phase frequency detector 300 detects phase error between a reference clock signal and the phase locked loop oscillator output. The phase frequency detector provides two output signals, UP 301 and DN 302. UP 301 and DN 302 operate in accordance with prior art phase frequency detectors. A charge pump circuit 305 according to the invention and having a sleep mode of operation receives the UP and DN signals 301 and 302. The signals are used in determination of a current output signal 308 from the charge pump to drive a VCO 310. The VCO 310 is a conventional VCO. Optionally, a filter is disposed between the charge pump circuit 305 and the VCO 310.

As with prior art phase locked loops, the VCO output 312 forms the clock output from the PLL circuit and provides a feedback signal to the phase frequency detector. When the reference clock 315 and the VCO output 312 are at different frequencies, optionally clock dividers 318 are used to divide the clocks to a common oscillating frequency.

According to the invention, logic 320 is added to the circuit for determining a state for the charge pump circuit 305 and for providing a signal 321 to the charge pump circuit 305 for placing the charge pump circuit 305 into sleep mode. The logic 320 may be configured in a number of fashions.

For example, a simple implementation is shown in FIG. 4. Here the UP and DN logic signals from the phase frequency detector 300 are NORed together. The output signal 321 is low when the charge pump circuit 305 is in its normal state of operation and high when it is to be in sleep mode.

Unfortunately, it is not practical to disable sleep mode and request an output signal from the charge pump circuit simultaneously. There is a settling time for the charge pump 305 once it exits sleep mode. Until the completion of the settling time, the charge pump output 308 is unsettled so it is preferable to not provide the output signal 308 from the charge pump circuit 305 until the settling time is expired.

Figure 4A:
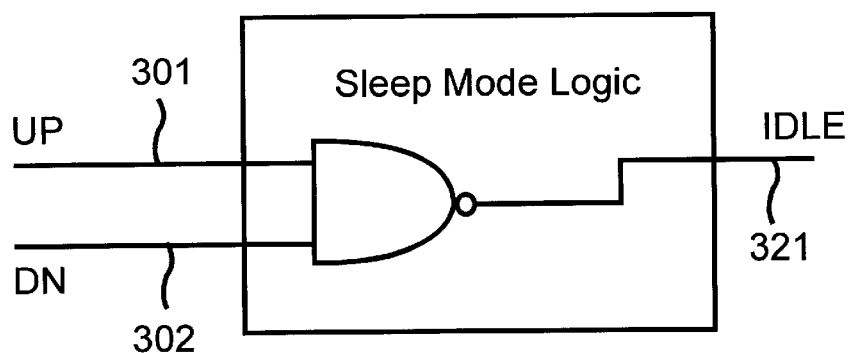
FIG. 4a and FIG. 4b show a simplified scheme of the digital phase locked loop circuit in accordance with the invention.
Figure 4B:
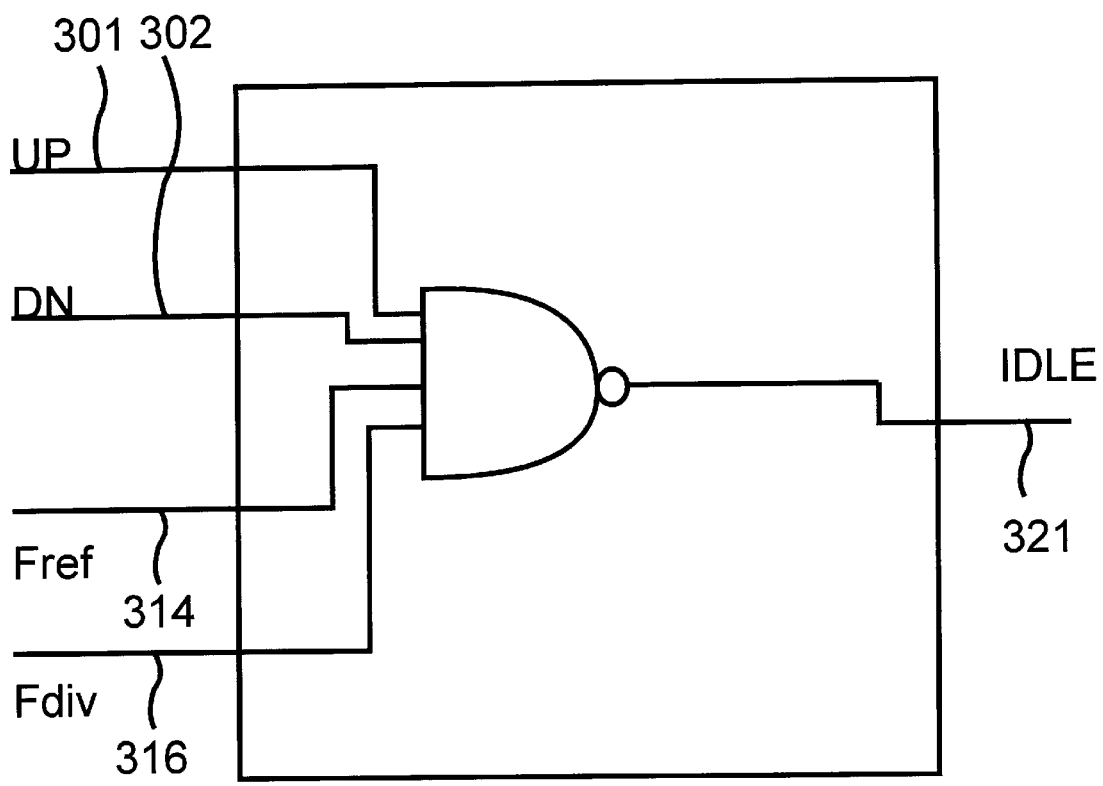

Referring to FIG. 4b, by way of example a practical implementation to realise this small delay is to take advantage of the duty cycle of the Fref 314 and Fdiv 316 signals. If PFD 300 is sensitive to the falling edges of the Fref 314 and Fdiv 316 signals, the rising edges of the Fref 314 and Fdiv 316 signals are used to generate the desired delay. Then the implementation of the control circuitry becomes IDLE=NOT(UP+DN+Fref+Fdiv).

This maintains the same polarity as for the circuit of FIG. 4a. Of course opposite polarities may also be used. If PFD 300 is sensitive to the rising edges of the Fref 314 and Fdiv 316 signals, the falling edges of the Fref 314 and Fdiv 316 signals are used to generate the desired delay and the logic is modified accordingly. The practical circuit could require additional circuitry to avoid glitches on the IDLE signal, due to the fact that the input signals UP, DN, Fref, Fdiv may be non-overlapping.

Figure 5:
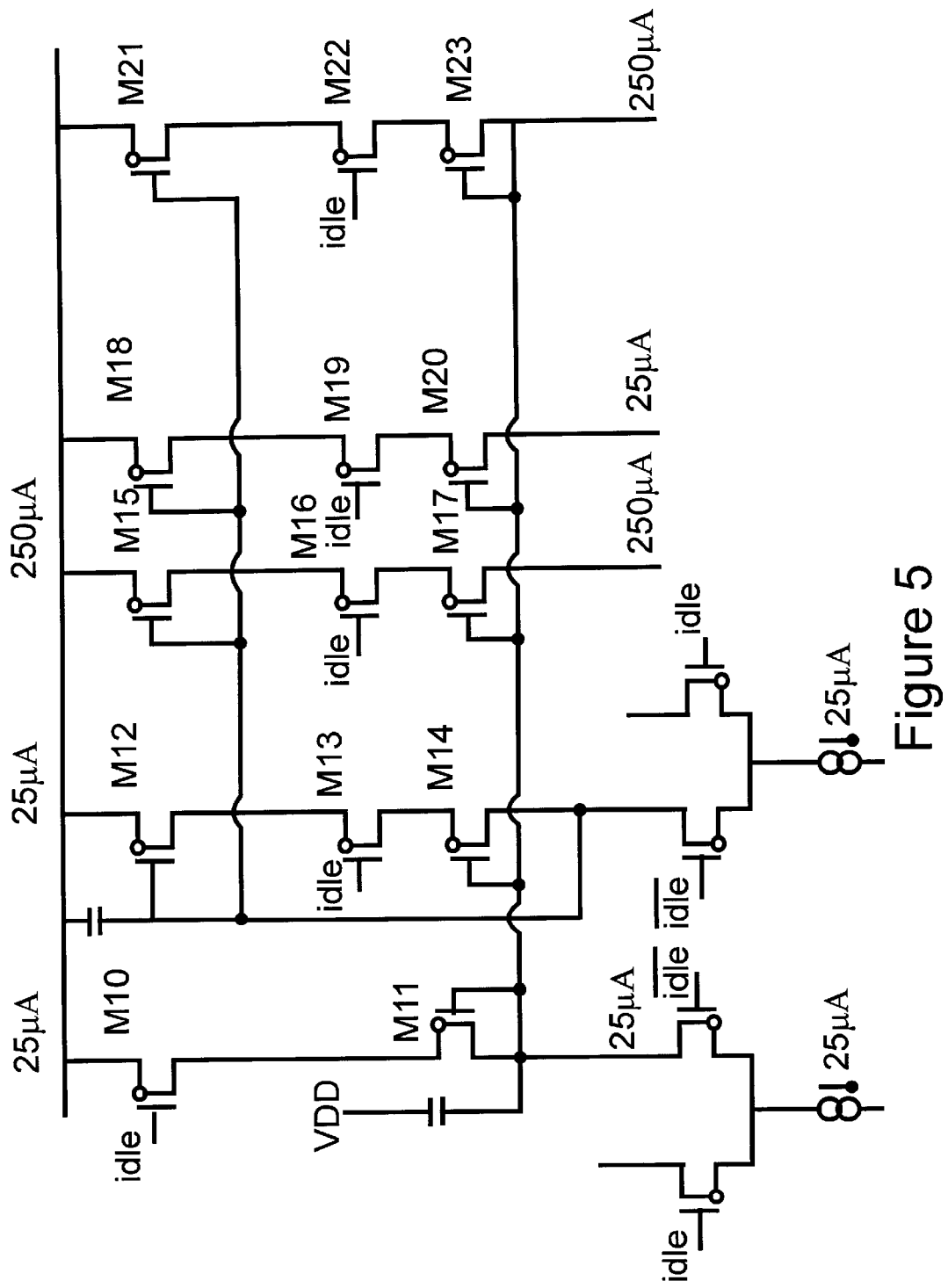
FIG. 5 shows a schematic diagram of a portion of the charge pump circuit.

Referring to FIG. 5, a schematic diagram of a portion of the charge pump circuit is shown. A plurality of transistors is arranged to provide a current source. Arrangement of transistors for this purpose is possible in several configurations, which are evident to those of skill in the art. A number of transistors are included for being switched in response to the IDLE signal in order to place the circuit in IDLE mode.

In order to achieve the desired circuit design, dimensions of the transistors are set appropriately so as to provide appropriate response across the transistors. For example, for M12 if it is desired to achieve a $V_{DS}$ of 0.45V, the dimensions of M11, M12, and M14+M10+M13 are selected accordingly. Obviously, dimensions are somewhat process related and depend upon design requirements.

As an example, the following numerical example is presented.

A phase locked loop has the following characteristics:

Fref=200 KHz

Tref=1/Fref=5 µs

IVDD (supply consumption)=750 µA when IDLE=0, 0 µA when IDLE=1

Delay (Settling time to activate charge pump)=100 µs

The average consumption by the charge pump is calculated as a product of the supply current IVDD and the duty cycle of the IDLE signal.

IVDD average=750 µA×100 ns/5 µs=15 µA

The result is for comparison with the 750 µA average consumption without the sleep mode of the present invention.

Figure 6:
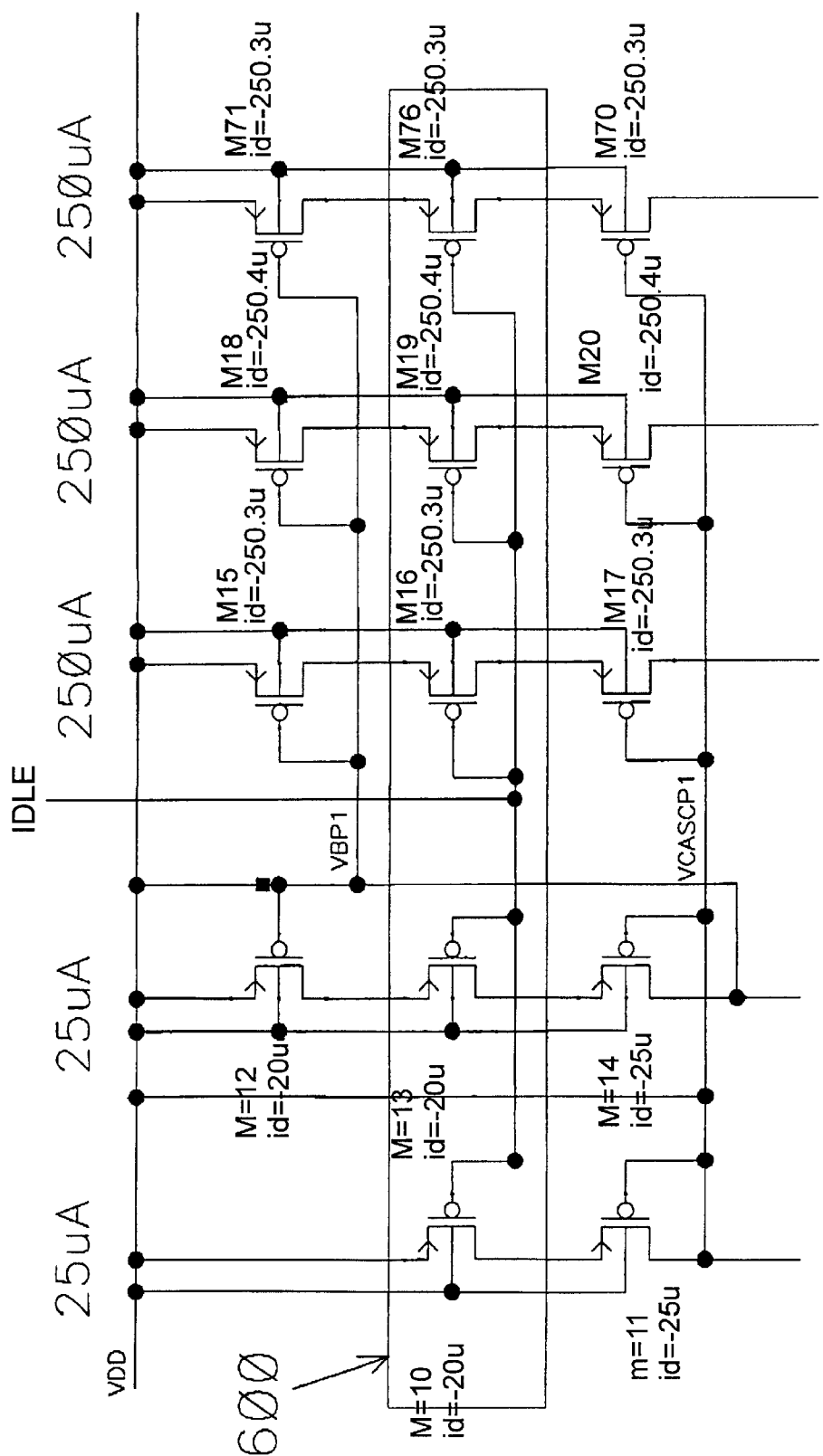
FIG. 6 shows a simulation diagram of the circuit of FIG. 5.

Referring to FIG. 6, a simulation diagram of the circuit of FIG. 5 is presented. The simulation results confirm proper operation of the circuit of FIG. 5 in accordance with the invention. The diagrams show the p channel side of the current source. A complementary diagram could be used for the n channel side as will be evident to those of skill in the art. The transistors within the box 600 are those which are added to conventional circuits in order to implement the idle mode according to the invention.

Figure 7:
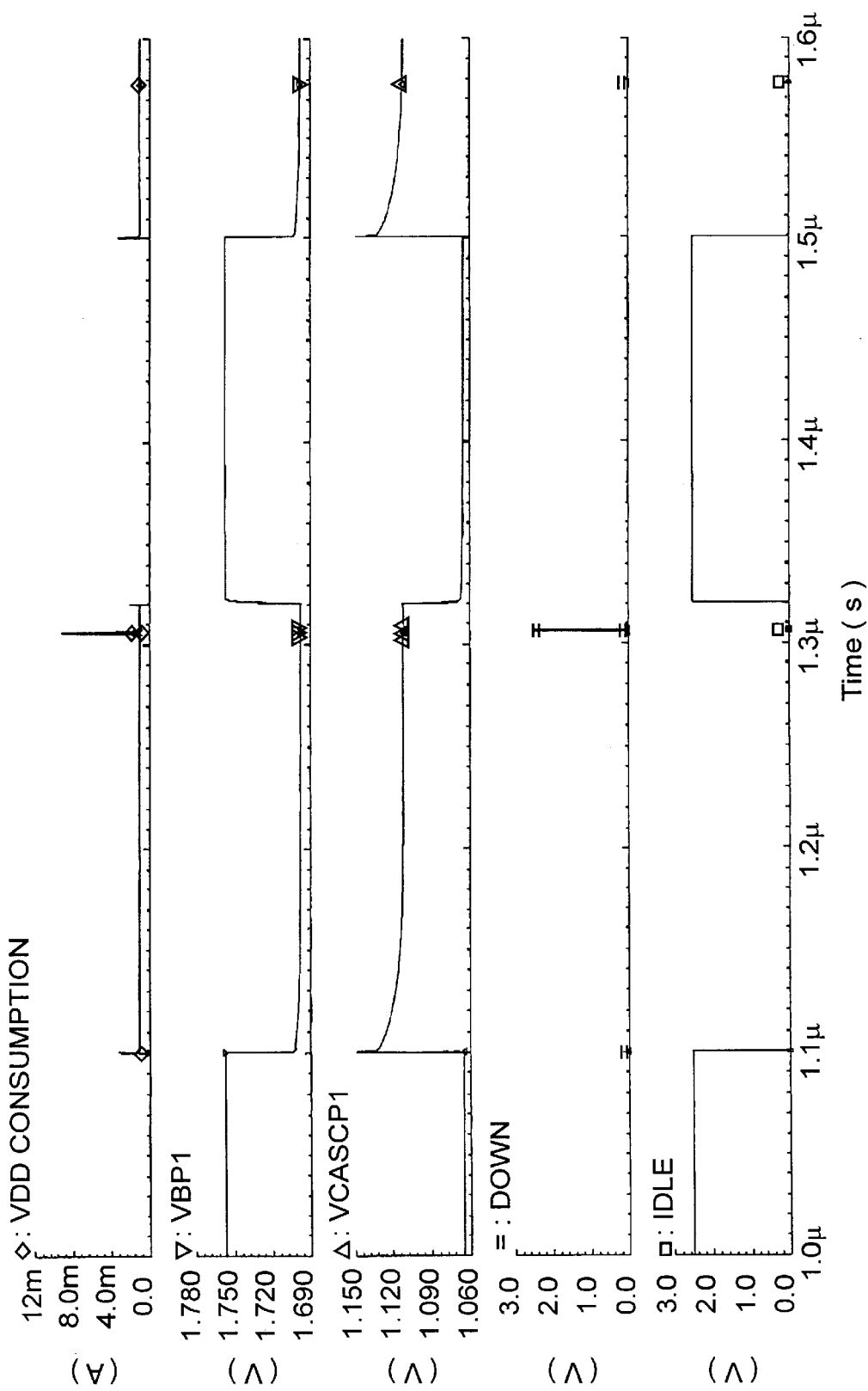
FIG. 7 shows a timing diagram of a circuit according to the present invention.

Referring to FIG. 7, a timing diagram of a circuit according to the invention is shown. The timing diagram is of a simulation result wherein the signals VCASCP1 and VBP1 are subject to less than 1 pF of capacitance. Also, the duration of the idle mode is shortened relative to actual occurrences in order to shorten the overall simulation time as shown in the diagram. For example the p MOS of the currant source circuit is controlled by the signal /VBP1. /VCASCP1 is a signal relating to the transistors M11, M14, M17, M20 etc. Clearly /DOWN and /IDLE1 are related to the DN signal and the IDLE mode signal described above.

By placing the charge pump in a idle mode, it is possible to reduce the power consumption of the charge pump circuit without adversely affecting the operation of the phase locked loop circuit. Typically, when the width of the pulses UP and DN are substantially narrower than the width of the clock period, a substantial amount of power is saved using the idle mode.

Optionally, a divide by M circuit 138 is used so that a direct comparison of the reference signal 124 ($F_{REF}$) with the phase locked loop signal 140 ($F_{Div}$) is possible. The divide by M frequency divider 138 (DIVM) receives the signal and divides its frequency by M to produce the signal $F_{Div}$ 140 applied to the PFD 126. The VCO 136 generates the output frequency 142 ($F_{out}$) based on the comparison between the reference frequency 124 ($F_{REF}$) and the frequency 140 ($F_{Div}$).

The above-described embodiments of the invention are intended to be examples of the present invention and numerous modifications, variations, and adaptations may be made to the particular embodiments of the invention without departing from the scope and spirit of the invention, which is defined in the claims.

What is claimed is:

1. A charge pump circuit for use with a phase locked loop comprising:

an input port for receiving a first signal indicative of a misalignment between two clock signals in a first state and of alignment of the two clock signals in a second other state;

an output port;

a circuit for providing a drive signal at the output port when the first signal is indicative of misalignment of the two clock signals; and, a circuit for entering a sleep mode to reduce power consumption of the charge pump when the first signal is indicative of alignment of the signals, the circuit comprising voltage storage for retaining an approximate charge level of /VCASCP1.

2. A charge pump circuit for use with a phase locked loop as defined in claim 1 wherein the circuit for providing a drive signal comprises:

a circuit for providing high impedance at the output port when the first signal is indicative of alignment of the signals.

3. A charge pump phase locked loop circuit as defined in claim 2 comprising:

a second port for receiving a sleep signal, the charge pump responsive to the sleep signal to reduce power consumption of the charge pump while the voltage of the sleep signal is within a predetermined range.

4. A charge pump phase locked loop circuit as defined in claim 3 comprising:

a second circuit for providing the sleep signal to the second port when the first signal is indicative of alignment of the signals.

5. A charge pump phase locked loop circuit as defined in claim 4 wherein the first signal comprises both an UP signal and a DN signal.

6. A charge pump phase locked loop circuit as defined in claim 4 wherein the first signal comprises a tristate signal having UP, ALIGNED, and DN as its three states.

7. A charge pump phase locked loop circuit as defined in claim 5 wherein the second circuit comprises means for providing other than a voltage within the predetermined range at least a predetermined time before providing to the charge pump an UP signal or a DN signal indicative of a misalignment.

8. A charge pump phase locked loop circuit as defined in claim 5 wherein the second circuit comprises means for providing other than a voltage within the predetermined range at least a predetermined time before providing to the charge pump a signal having an UP or DN state.

9. A charge pump phase locked loop circuit as defined in claim 4 wherein the second circuit comprises means for providing other than a voltage within the predetermined range at least a predetermined time before providing from the charge pump a signal for correcting misalignment between the two clock signals.

10. A charge pump phase locked loop circuit as defined in claim 1 wherein the circuit for entering a sleep mode to reduce power consumption of the charge pump is an integral part of the circuit for providing a drive signal.

11. A charge pump phase locked loop circuit as defined in claim 10 wherein the circuit for entering a sleep mode to reduce power consumption of the charge pump comprises a plurality of transistors for switching between a first mode in which the charge pump provides power at the output port and a second mode in which the charge pump consumes a reduced amount of power when compared to the first mode.

12. A charge pump phase locked loop circuit as defined in claim 11 comprising a power input port and wherein the transistors are disposed electrically between the power input port and the output port.

13. A charge pump phase locked loop circuit for use with a phase locked loop comprising:
  an input port for receiving a first signal indicative of a misalignment between two clock signals in a first state and of alignment of the two clock signals in a second other state;
  an output port;
  a circuit for providing a drive signal at the output port when the first signal is indicative of misalignment of the two clock signals;
  a circuit for entering a sleep mode to reduce power consumption of the charge pump when the first signal is indicative of alignment of the signals;
  wherein the circuit for providing a drive signal comprises:
    a circuit for providing high impedance at the output port when the first signal is indicative of alignment of the signals;
    a second port for receiving a sleep signal, the charge pump responsive to the sleep signal to reduce power consumption of the charge pump while the voltage of the sleep signal is within a predetermined range;
    a second circuit for providing the sleep signal to the second port when the first signal is indicative of alignment of the signals;
    wherein the second circuit is for providing the sleep signal in accordance with the following logic:

Sleep signal=NOT(UP+DN+$F$ref+$F$div).

14. A charge pump phase locked loop circuit comprising:
  a voltage controlled oscillation circuit for receiving a drive signal and for providing a clock signal having an oscillation frequency controlled in dependence upon the drive signal;
  a phase frequency discriminator for receiving a reference signal and for comparing a phase of the reference signal with a phase of one of a first signal derived from the clock signal and the clock signal and for providing a comparison result indicative of phase alignment of the signals; and,
  a charge pump circuit comprising an output port, the charge pump circuit for providing the drive signal at the output port when the comparison result is indicative of misalignment of the signals and for providing high impedance at the output port when the comparison result is indicative of alignment of the signals, the charge pump circuit comprising logic for reducing power consumption of the charge pump circuit when providing a high impedance at the output port and voltage storage for retaining an approximate charge level of /VCASCP1.

15. A charge pump phase locked loop circuit as defined in claim 14 comprising:
  a programmable divider for receiving a signal based on the clock signal and for providing the first signal based thereon.

16. A charge pump phase locked loop circuit as defined in claim 14 wherein the charge pump circuit comprises an input port for receiving a second input signal, the charge pump responsive to the second input signal to reduce power consumption of the charge pump while the voltage of the input signal is within a predetermined range.

17. A method of moderating power consumption of a charge pump circuit having an output port for use with a phase locked loop comprising the steps of:
  receiving a signal indicative of a misalignment between two clock signals;
  providing a drive signal at the output port when the comparison result is indicative of misalignment of the signals; and,
  causing the charge pump to enter a sleep mode to reduce power consumption of the charge pump, when the comparison result is indicative of alignment of the signals and while in sleep mode retaining an approximate charge level of /VCASCP1.

18. A method of moderating power consumption of a charge pump circuit having an output port for use with a phase locked loop as defined in claim 17 wherein the step of: causing the charge pump to enter a sleep mode to reduce power consumption of the charge pump, when the comparison result is indicative of alignment of the signals includes the step of causing the charge pump to exit sleep mode a set up time before providing from the charge pump a signal to vary the first clock signal frequency.

19. A method of moderating power consumption of a charge pump circuit having an output port for use with a phase locked loop as defined in claim 17 comprising the step of: providing high impedance at the output port when the comparison result is indicative of alignment of the signals.

* * * * *